United States Patent
Bjornsson et al.

(10) Patent No.: US 12,306,261 B1
(45) Date of Patent: May 20, 2025

(54) BATTERY HEALTH MONITORING SYSTEM

(71) Applicant: Lunar Energy, Inc., Mountain View, CA (US)

(72) Inventors: Erin E. Bjornsson, Portland, OR (US); Gokhan Budan, Oxford (GB); Mark Holveck, Sunnyvale, CA (US)

(73) Assignee: Lunar Energy, Inc., Mountain View, CA (US)

( * ) Notice: Subject to any disclaimer, the term of this patent is extended or adjusted under 35 U.S.C. 154(b) by 0 days.

(21) Appl. No.: 18/792,150

(22) Filed: Aug. 1, 2024

(51) Int. Cl.
| | | |
|---|---|---|
| *G01R 31/392* | (2019.01) | |
| *G01R 31/367* | (2019.01) | |
| *G01R 31/385* | (2019.01) | |
| *G01R 31/389* | (2019.01) | |

(52) U.S. Cl.
CPC ......... *G01R 31/392* (2019.01); *G01R 31/367* (2019.01); *G01R 31/386* (2019.01); *G01R 31/389* (2019.01)

(58) Field of Classification Search
CPC .. G01R 31/392; G01R 31/367; G01R 31/386; G01R 31/389
See application file for complete search history.

(56) References Cited

U.S. PATENT DOCUMENTS

| | | | |
|---|---|---|---|
| 11,085,969 B2 | 8/2021 | Drees | |
| 11,681,967 B2 | 6/2023 | Roy | |
| 2016/0105042 A1* | 4/2016 | Taylor | H02J 7/0016 320/134 |
| 2016/0118789 A1* | 4/2016 | Fornage | H02J 7/0063 307/52 |
| 2022/0261715 A1* | 8/2022 | Roy | H02J 3/32 |
| 2022/0302724 A1* | 9/2022 | Sharma | H02J 7/0048 |

OTHER PUBLICATIONS

Author Unknown, Electrochemical Impedance Spectroscopy (EIS) for Batteries, Analog Devices, Aug. 2020.
Cho et al., Analysis of the Effect of the Variable Charging Current Control Method on Cycle Life of Li-ion Batteries, Energies, 2019.

* cited by examiner

*Primary Examiner* — Ricky Go
(74) *Attorney, Agent, or Firm* — Van Pelt, Yi & James LLP

(57) ABSTRACT

A power converter is used to generate a measurement-related AC signal. At a battery, the measurement-related AC signal is received and the measurement-related AC signal is responded to. Battery state information associated with the battery responding to the measurement-related AC signal is received. A battery health metric is determined based at least in part on the battery state information.

15 Claims, 10 Drawing Sheets

Measurements Taken When Battery Pre-Characterization Information is Used

BATTERY HEALTH MONITORING SYSTEM

BACKGROUND OF THE INVENTION

Electrochemical Impedance Spectroscopy (EIS) is a technique for measuring the impedance of a battery over a sweep or range of frequencies. Wear and/or aging of a battery causes changes in the chemistry and performance of the battery, and by measuring the impedance of the battery over a range of frequencies using EIS or some other technique, health metrics of the battery can be determined from the obtained impedances (e.g., state of health (SOH) of the battery, state of charge (SOC) of the battery, etc.).

Although battery health is able to be measured relatively easily in a laboratory setting, the battery health of at least some currently-deployed power systems cannot currently be measured in the field. Although some semiconductor manufacturers are developing integrated circuits (i.e., "hardware chips") that perform EIS measurements or other battery health related estimates, these solutions are relatively new and are a next-generation solution. For example, it takes time for power system manufacturers to integrate such EIS integrated circuits into their products. Likewise, on the consumer side, it takes time for consumers to upgrade to next-generation products with EIS integrated circuits. It would be desirable if new battery health estimation techniques (e.g., which perform EIS or similar measurement or estimation techniques) could be developed which do not require the integration of new chips and/or can be performed now by currently-deployed systems.

BRIEF DESCRIPTION OF THE DRAWINGS

Various embodiments of the invention are disclosed in the following detailed description and the accompanying drawings.

DETAILED DESCRIPTION

Figure 1:
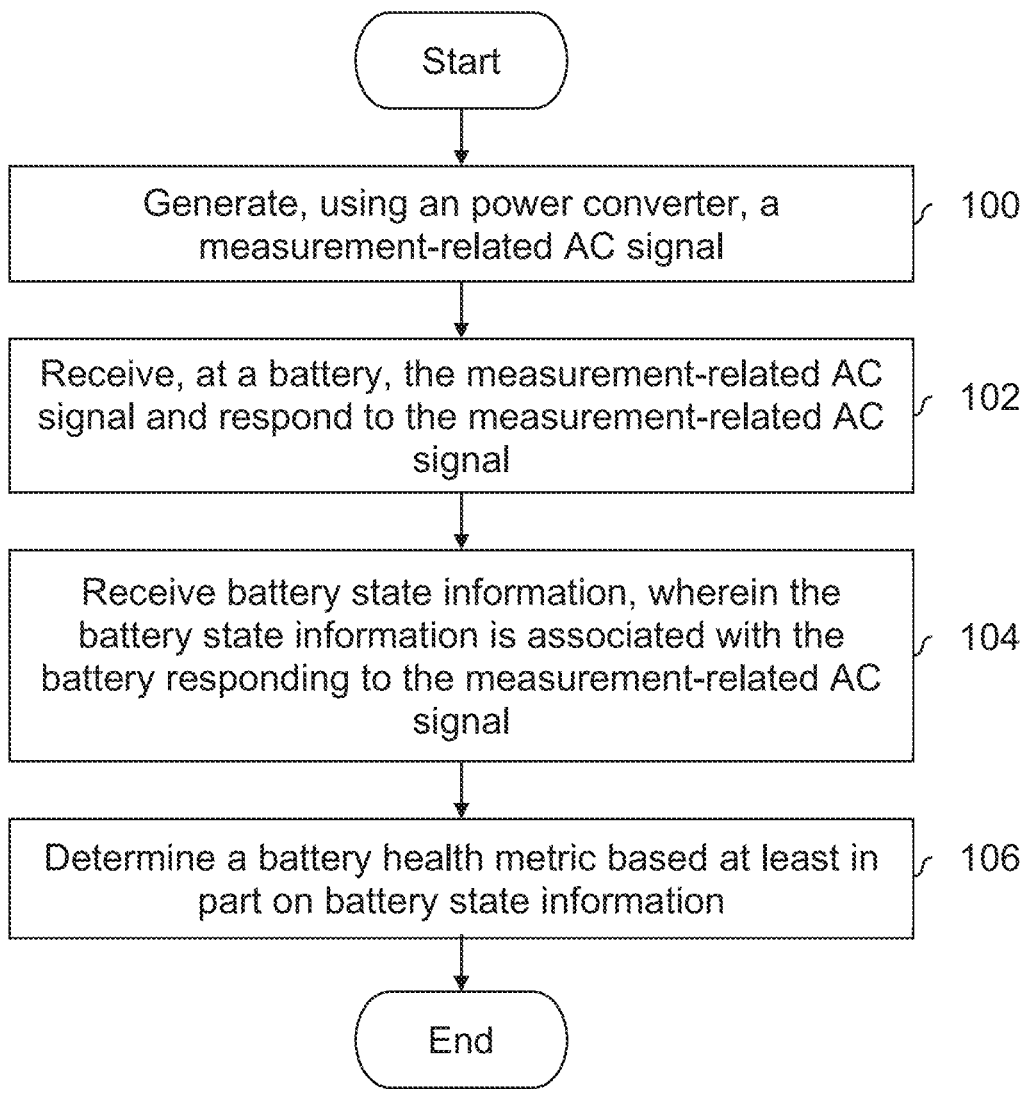
FIG. 1 is a flowchart illustrating an embodiment of a process to generate a battery health metric, including by using a power converter to generate a measurement-related AC signal.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various embodiments and/or techniques associated with using a (e.g., in the field, already deployed) power converter in a power system to generate a measurement-related AC signal are described herein. This measurement-related AC signal is passed to one or more batteries (e.g., battery blocks, battery modules, etc.) in a power system from which battery state information is obtained, where the battery state information is in turn used to generate a battery health metric.

As will be described in more detail below, a benefit associated with the measurement embodiments and/or techniques described herein is that existing hardware components and/or sub-systems are used, without having to upgrade or otherwise replace existing hardware (e.g., which can be expensive and/or inconvenient). In some embodiments, the techniques described herein are implemented using a firmware update that configures, manages, and/or instructs existing hardware components and/or sub-systems in new ways to perform health-related measurements. The following figure illustrates one example of a process to generate a battery health metric, including by using a (e.g., in the field, already deployed) power converter to generate a measurement-related AC signal.

FIG. 1 is a flowchart illustrating an embodiment of a process to generate a battery health metric, including by using a power converter to generate a measurement-related AC signal. For example, a power system may already have a power converter (e.g., that is used for non-health related purposes) and the AC signal that is generated by the power converter is repurposed and/or modified into one that is used in performing a measurement of the battery block.

In some embodiments, the techniques described herein are used to generate a battery health metric for a battery block. As used herein, the term "battery block" refers to a collection or group of battery cells. In some embodiments, multiple battery modules are grouped and managed together in a larger collection, such as a battery block. In some embodiments, the techniques described herein are used to generate a battery health metric for a battery module. For convenience and brevity, some of the examples described herein may simply refer to a battery, but it is understood that the techniques described herein may refer to any collection or grouping of batteries and/or battery cells, including but not limited to a battery module or a battery block.

In some embodiments, a power system (e.g., which includes one or more battery blocks and/or battery modules for which a battery health metric is generated per the techniques described herein) is an energy storage system (ESS) that is coupled to and stores energy from one or more photovoltaic (PV) panel(s) and/or from a utility grid. An ESS (or, more generally, a power system) may include one or more batteries, where each battery includes a plurality of battery cells. An exemplary block diagram describing an ESS is described in more detail below.

In some embodiments, the (e.g., health-related) techniques described herein are performed without first checking whether the battery being evaluated or otherwise assessed is at rest (e.g., is not being charged, or is not discharging to power some load). For example, the process of FIG. 1 (or similar health assessment techniques) may be scheduled (e.g., once a week) or performed at random times. This may be preferable over prior art techniques that first check whether a battery is at rest because an ESS or other power system may be (e.g., severely) resource limited and performing such an assessment (e.g., whether a given battery is at rest or not) may consume scarce processing resources and/or require a significant amount of time.

In some embodiments, the process of FIG. 1 is performed (at least in part) by a controller or a processor, for example, in an inverter module in a modular ESS system, where the inverter module further includes a power converter. For example, in a modular ESS system, a variable number of battery modules (e.g., 1, 2, 3, or 4 battery modules) may be included in the system depending upon a desired battery capacity. The inverter module acts as the "brains" of the modular ESS system, controlling and/or making management decisions for the battery module(s).

In some embodiments, at least some part of FIG. 1 is performed off-device (e.g., not on an ESS system), for example, by a server connected to a modular ESS system via some network. For example, an inverter module in a modular ESS system may collect the power system state information and send it to a server which decides whether to perform a health-related measurement and if so, on which batteries (e.g., which battery blocks or battery modules). These examples of which device or component performs the decision making (e.g., at step 102) are merely exemplary and are not intended to be limiting.

At 100, a measurement-related AC signal, associated with performing a health-related measurement of a battery, is generated using a power converter.

As used herein, the term "measurement-related AC signal" refers to an AC signal that is used to configure or otherwise put one or more receiving battery (e.g., blocks, modules, etc.) into a (e.g., good and/or appropriate) state in which a measurement of those battery block(s) is performed. An example waveform of a measurement-related AC signal is described in more detail below.

In one example, the system is a modular ESS example that interfaces with a utility grid which operates in AC and the modular ESS system has internal (e.g., power) buses which operate in DC. To accommodate both AC and DC power, the exemplary modular ESS already includes a power converter, which performs DC to AC conversion, as well as AC to DC conversion. The power converter may be reconfigured or otherwise repurposed (e.g., by some controller) to generate a (e.g., special and/or new) type of an AC signal which is fed to one or more battery block(s) (e.g., in some embodiments on top of DC power or a DC signal) and subsequently measurements are taken from those battery block(s).

In some embodiments, the measurement-related AC signal (e.g., that is generated at 106) includes a continuous range of frequencies. For example, a power converter may be instructed or configured to sweep the battery block over a continuous range of frequencies.

Alternatively, in some other embodiments, the power converter may be instructed or configured to generate a measurement-related AC signal at a specific, discrete frequency. A discrete frequency approach may be preferred in some resource-limited applications where (as an example) the power system does not have the resources to measure (e.g., frequently enough) the response of the battery block to the measurement-related AC signal as the frequency of the measurement-related AC signal changes across some continuous range of frequencies (e.g., to obtain sufficient or proper correlation because cause and effect). Also, sweeping over a continuous range of frequencies as opposed to using only a (e.g., few) discrete frequencies requires a significant amount of memory to store the measured information (e.g., the battery state information received at 108). Generating and using measurement-related AC signals at discrete frequencies (as opposed to sweeping a continuous range of frequencies) may be preferable in resource-limited systems for these reasons. (It is noted that for these reasons, other, existing EIS-based approaches are similarly undesirable in many real-world, in-the-field applications.) An example that uses only a few measurements at a few discrete frequencies (and that is well-suited to resource-limited applications) is described in more detail below.

Returning to the process of FIG. 1, at 104, battery state information is received, wherein the battery state information is associated with the battery responding to the measurement-related AC signal. As described above, the battery may be a battery module, a battery block, etc.

In some embodiments, the measurement-related AC (e.g., power) signal (e.g., that is generated at step 100) is overlaid on top of and/or combined with a DC (e.g., power) signal and the combined AC and DC (e.g., power) signal is passed to one or more batteries, those batteries respond to the measurement-related AC signal as well as the DC signal, and the responsive batteries are measured.

In some embodiments, a battery management system (BMS) module (or sub-system) is associated with and/or manages a given battery, and the BMS module collects or otherwise receives the battery state information (e.g., at step 104) and forwards that information (e.g., to an inverter module or a next link in a communication chain). In some embodiments, the battery state information is received (e.g., at step 104) by a processor or controller (e.g., that generates a battery health metric battery state information).

In some embodiments, the battery state information (e.g., received at 104) includes one or more of the following:

temperature, voltage, or current. In some embodiments, the battery state information includes a local (e.g., battery) estimation such as state of charge (SoC).

Returning to the process of FIG. 1, at 106, a battery health metric is determined based at least in part on battery state information.

In some embodiments, a battery health metric (e.g., generated at 106) includes one or more of the following: a (e.g., real) capacity (e.g., where a fresh battery block straight from the factory has a (e.g., real) capacity in excess of 100% (e.g., because a fresh battery will have a higher capacity than the nominal capacity that is stated in the datasheet) which decreases with time, wear, chemical degradation, etc.) or an impedance (e.g., associated with a particular (AC) frequency which increases with time, wear, chemical degradation, etc.).

The specific battery health metrics described above (i.e., capacity, impedance, etc.) are merely exemplary and are not intended to be limiting. In various embodiments, a battery health metric may describe, estimate, or otherwise indicate the quality, performance, and/or degradation of battery block(s) and/or battery cell(s) due to a variety of chemical, mechanical, and/or electrical causes.

The battery health metric that is generated at step 110 may refer to a variety of battery units or groups and in various embodiments will vary (e.g., depending upon the application and/or implementation of the power system). For example, if a particular power system implementation is able to independently put (e.g., individual or single) battery blocks into a measurement state (e.g., while other battery blocks are used to power some load), the battery health metric that is generated at 110 may refer to a specific battery block. Alternatively, in some configurations where multiple battery blocks are tied together and/or are not able to be independently put into a measurement state and measured, the battery health metric may be for a group of (e.g., tied together) battery blocks.

As will be described in more detail below, in some embodiments, generating the measurement-related AC signal (e.g., at 106) includes generating the measurement-related AC signal at one or more discrete frequencies (e.g., there is no sweep across some continuous range of frequencies), the battery state information (e.g., received at 108) includes discrete-frequency state information associated with the battery block responding to the measurement-related AC signal at the one or more discrete frequencies, and determining the battery health metric (e.g., at step 110) includes comparing the discrete-frequency state information against (e.g., stored) battery pre-characterization information.

In one example, battery pre-characterization information is obtained from a collection of sample battery blocks in a laboratory setting, where the sample battery blocks span a range of states, ages, degrees of wear, and/or healthiness. To put it another way, the collection may include old and worn-out battery blocks, newly-manufactured battery blocks with little wear or degradation, and battery blocks in the middle (e.g., of moderate age with moderate wear). All of the samples in the collection (at least in this example) are measured at one or more discrete frequencies (e.g., the same that will be used in the field) and battery state information (e.g., the same measurements or information that will be collected in the field) is collected and stored. This information is then used as the battery pre-characterization information (at least in some embodiments).

In some embodiments, the exemplary process of FIG. 1 is at least partially implemented in computer instructions (e.g., stored on computer readable storage media and performed by an associated processor) and/or firmware (e.g., stored in storage or memory in a System on a Chip (SoC) and performed by an associated (micro) processor in the SoC). For example, by implementing at least some of the process of FIG. 1 in computer instructions and/or firmware, a new ability to generate a battery health metric for the power system (e.g., which was not previously able to be performed) may be implemented or otherwise rolled out via a (e.g., firmware) update, without requiring new hardware components in the power system.

It may be helpful to show an example power system that performs the exemplary process of FIG. 1. The following figures illustrate some example systems.

Figure 2:
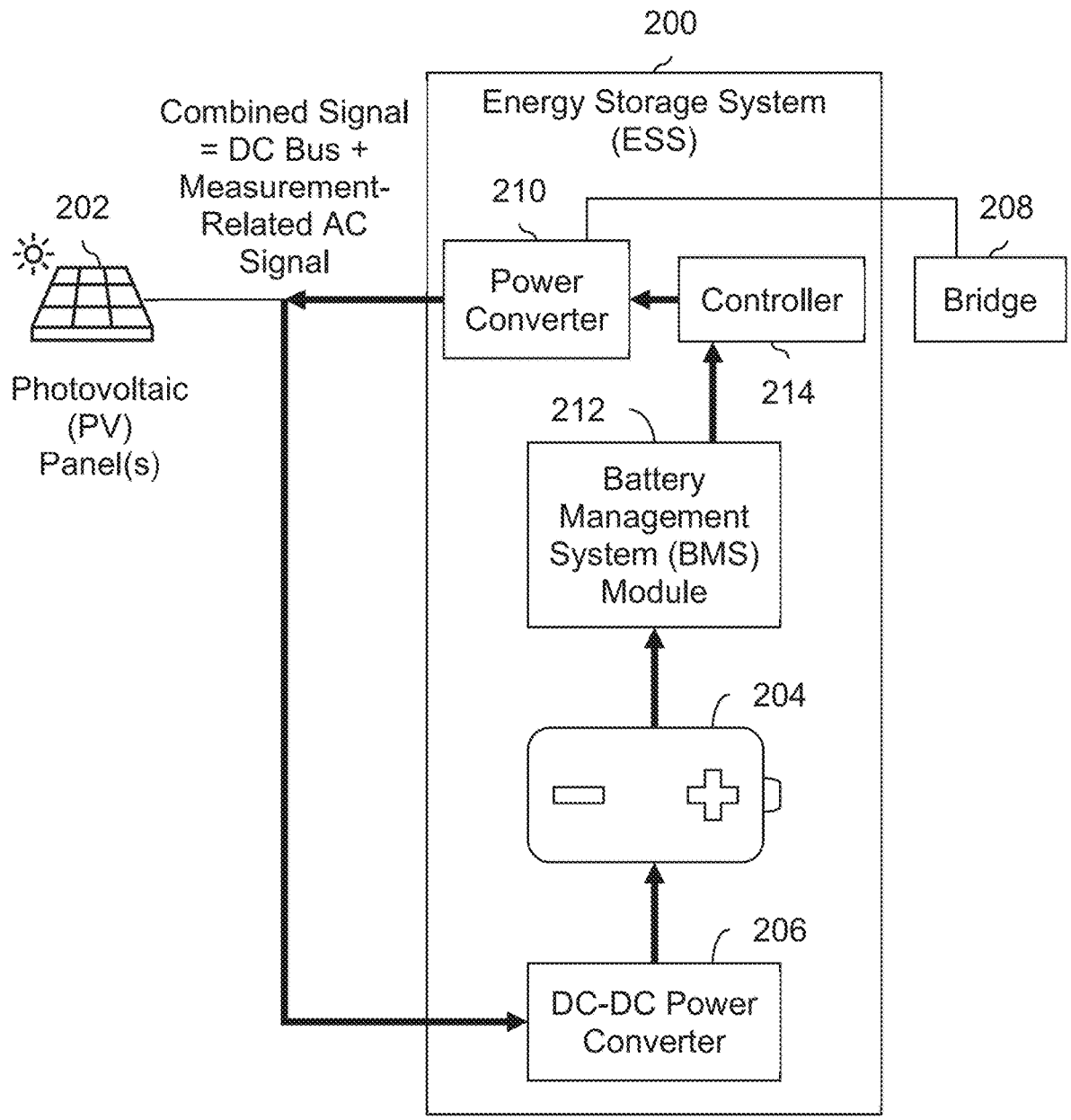
FIG. 2 is a block diagram illustrating an embodiment of an energy storage system (ESS) that generates a battery health metric using a power converter to generate a measurement-related AC signal.

FIG. 2 is a block diagram illustrating an embodiment of an energy storage system (ESS) that generates a battery health metric using a power converter to generate a measurement-related AC signal. For simplicity and ease of explanation, some components that are not directly related to the health estimation and/or monitoring technique(s) described herein are not shown.

In this example, the ESS (200) stores energy generated from one or more photovoltaic (PV) panel(s) (202). Energy is passed from the PV panels(s) (202) to the ESS (200) via a DC bus, where the voltage of the DC bus is permitted and/or expected to fluctuate, so that devices and/or systems that are attached to the DC bus are designed for or are otherwise able to handle fluctuating and/or variable voltages. Within the ESS (200), the power converter (210) and the DC-DC power converter (206) are attached to the PV panel(s) (202) via this bus.

The ESS (200) also interfaces with a bridge (208), which in this example is used to exchange AC energy between the ESS (200) and devices or systems beyond the bridge (208). For example, AC energy may flow out from the ESS (200) to the bridge (208) when a load (not shown) beyond the bridge is powered by the energy stored in the battery block(s) (204). Or, AC energy may flow into the ESS (200) from the bridge (208) when the battery block(s) (204) are being charged by a utility grid (not shown) beyond the bridge. To convert between AC energy (e.g., exchanged with the bridge (208)) and DC energy and/or DC buses internal to the ESS (200), the ESS includes a power converter (210) which converts from AC to DC as well as from DC to AC.

In some embodiments, the power converter is an inverter, for example with a certain subset of power electronic topologies that are capable of converting between DC and AC, where AC is defined as being bi-polar (e.g., sometimes positive, sometimes negative). Alternatively, in some other embodiments, the power converter is implemented with a different type of power electronic topologies (i.e., where AC is not bi-polar). For example, the latter type of embodiment may be a design choice that is specific to some ESS manufacturers.

In this example, the ESS (200) also includes a battery management system (BMS) module (212). In this example, the power converter (210) receives battery state information from the battery block(s) (204). The BMS module (212) records voltage, temperature, and current datapoints and may record other metadata and/or other information which can be used to correlate a voltage, temperature, and current datapoint with other information (e.g., which frequency the datapoint is associated with, a datapoint in battery pre-characterization information, etc.). For example, the BMS module (212) may timestamp each voltage, temperature, and current datapoint. In some embodiments, if there are multiple battery blocks (e.g., 204) or other types of battery modules or groups, a single BMS module is used to collect information for all battery blocks. Alternatively, each battery block may have its own BMS module in some other embodiments.

All of the hardware components and/or power electronics described above (i.e., the power converter (210), the DC-DC power converter (206), and the BMS module (212)) may be repurposed or otherwise (re-)used to perform battery health measurements without the need to replace and/or update hardware components and/or power electronics in the ESS (200). For example, firmware (not shown) running on the controller (214) may be updated (at least in this example) to perform the example process of FIG. 1. In one example, the controller (214) instructs the power converter (210) to generate a measurement-related AC signal, which is output on and combined with the DC bus, so that a combined signal comprising the DC bus plus measurement-related AC signal is driven or otherwise output on that signal or bus. As described above, all of the devices and/or systems coupled to that signal or bus are expecting and/or able to accommodate fluctuations in the voltage of that signal or bus, so the addition or introduction of the measurement-related AC signal (e.g., on top of the DC bus) is able to be accommodated by the devices and/or systems hanging off of that signal or bus.

For example, prior to the instruction of this health-related measurement technique, the voltage of the DC bus may have changed relatively slowly, for example on the order of ±1%. With the introduction of the measurement-related AC signal on top of the (much more slowly changing) DC bus, the rate of change is on the order of ±3%.

The combined signal is input by the DC-DC power converter (206), which (even after any voltage conversion) maintains some of the "ripples" and/or frequency of the measurement-related AC signal that sits on top of the DC signal. The converted voltage is passed from the DC-DC power converter (206) to the battery blocks(s) (204). Battery state information is then obtained from the battery blocks(s) (204) by the BMS module (212). The BMS module (212) passes the battery state information to the controller (214), which uses the battery state information to generate a battery health metric.

In some embodiments, the ESS (200) described above is already deployed in the field and the hardware components and/or power electronics described above are connected to each other in the ESS (200) via a controller area network (CAN) bus. Having a CAN bus may be advantageous and/or useful because it enables the various hardware components and/or power electronics to exchange information with each other. For example, Lunar Energy, Inc. offers an ESS with a CAN bus and some of the connections in ESS (200) may be implemented using such a CAN bus. Some other ESS manufacturers may not have a CAN bus so that there is no communication channel to (re) configure hardware components into proper states or modes (e.g., without a CAN bus where connected modules, such as those described above, can be configured) and/or a way to exchange information (e.g., without a CAN bus via which information is exchanged between connected modules) to generate a battery health metric.

It may be helpful to illustrate an example of the combined signal that connects the PV panel(s) (202), the power converter (210), and the DC-DC power converter (206). The following figure illustrates an example of this.

Figure 3:
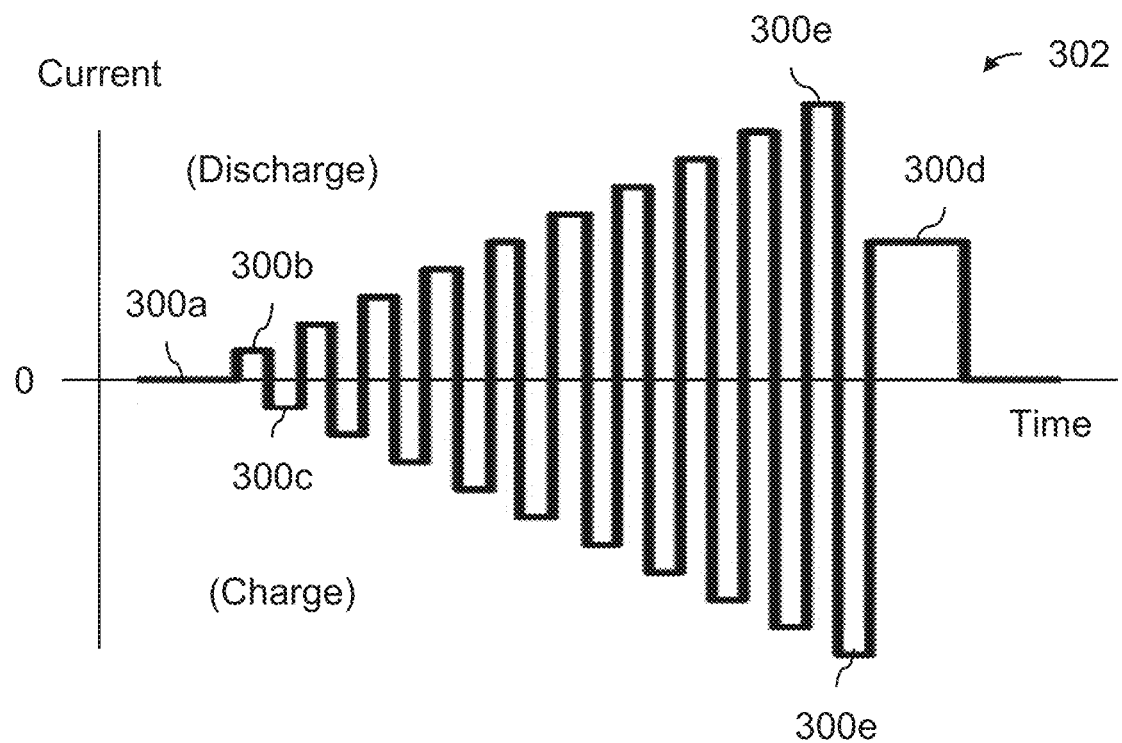
FIG. 3 is a graph illustrating an embodiment of a signal associated with performing a health-related measurement.

FIG. 3 is a graph illustrating an embodiment of a signal associated with performing a health-related measurement. In this example, the waveform (302) is an example of the signal in FIG. 2 that connects the PV panel(s) (202), the power converter (210), and the DC-DC power converter (206) when the system is performing some measurement to determine a battery health metric. In this example, the waveform (302) is a step function where the level of the current begins at 0 (300a), which is associated with neither charging nor discharging the battery (e.g., a neutral state).

The level of the current is then (300b) held at a positive value where the positive current value is associated with discharging the battery. The level of the current is then (300c) held at a negative value (e.g., the same magnitude as the immediately preceding discharge cycle (300b)) where the negative current value is associated with charging the battery.

This discharging-charging sequence is then repeated over and over for successively larger magnitudes until there is a final discharge cycle (300d) for a longer duration than the immediately preceding charge cycle (300e) and at a smaller magnitude (e.g., approximately half) than the immediately preceding charge cycle (300e).

As described above, in some embodiments, battery pre-characterization information is used during the determination or calculation of a battery health metric (e.g., at step 110 in FIG. 1). The following figures illustrate a benefit of using battery pre-characterization information.

Figure 4A:
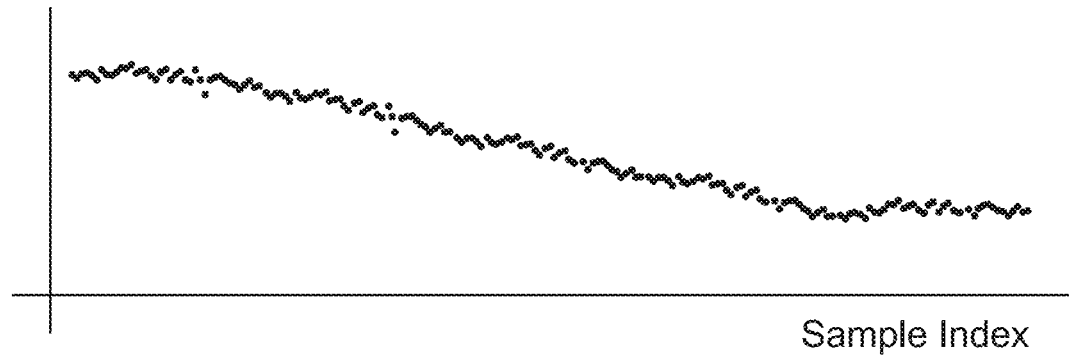
FIG. 4A is a graph illustrating an embodiment of measurements taken to determine a battery health metric without battery pre-characterization information.

FIG. 4A is a graph illustrating an embodiment of measurements taken to determine a battery health metric without battery pre-characterization information. In this example, the graph (400) has an x-axis showing a sample index (e.g., the index or number of a given sample) and the y-axis shows the corresponding measurement value (e.g., temperature, voltage, or current) that is obtained for that sample (index).

To determine or otherwise calculate a battery health metric with a desired level of accuracy, a (relatively) substantial number of measurements must be performed (e.g., assuming battery pre-characterization information is not used). In contrast, if pre-characterization information is used, a smaller number of samples would be sufficient to produce a battery health metric with a desired and/or sufficient level of accuracy. The following figure shows an example of this.

Figure 4B:
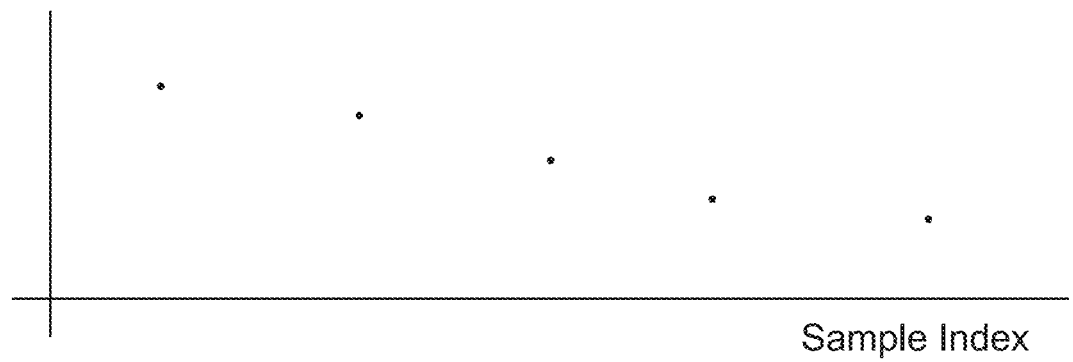
FIG. 4B is a graph illustrating an embodiment of measurements taken to determine a battery health metric using battery pre-characterization information.

FIG. 4B is a graph illustrating an embodiment of measurements taken to determine a battery health metric using battery pre-characterization information. In this example, battery pre-characterization information is used, in combination with the measurements taken (402), to generate a battery health metric. As in the previous example, the graph (402) has an x-axis that corresponds to sample index (e.g., the index or number of a given sample), and the y-axis is the value of the measurement taken.

As described above, battery pre-characterization information is obtained (at least in some embodiments) ahead of time from a collection of battery blocks at varying states, ages, and/or degrees of wear and/or degradation in a laboratory. From this collection, a spectrum or range of battery health metrics and battery state information (e.g., the same types of measurements shown on the y-axis of graph 402) can be obtained and stored.

This stored and/or lab-obtained information (i.e., the battery pre-characterization information) is then compared against the (e.g., newly-measured) battery state information and a battery health metric can be estimated or otherwise generated (e.g., using interpolation or extrapolation). The use of battery pre-characterization information permits fewer measurements to be taken (e.g., in the field) while still producing a sufficiently accurate battery health metric. In the field, performing health-related measurements and related operations takes time, bandwidth, and/or resources away from primary-objective operations. As such, it is desirable to minimize the number of measurements that must be performed to generate a battery health metric.

For example, with battery pre-characterization information, a system that implements the technique(s) described herein may be more efficient (e.g., with respect to computing and/or other system resources) than other systems which do not implement the techniques described herein. This may be with respect to 1) the frequency of health measurement (e.g., the techniques described herein may enable (e.g., infrequent) testing every couple of weeks, or even once a month), 2) duration of the health measurement mode or state (e.g., the total duration of the signal (302) shown in FIG. 3 may be 5 minutes or less, which is shorter than other techniques or systems), and/or 3) the degree or level of the health measurement (e.g., including the magnitude or duration of the discharge cycles (e.g., 300b, 300d, and 300e) in FIG. 3, which may be lower than some other techniques so that it is less noticeable by a user and/or "takes away" less energy from other applications, loads, or uses).

The following figure illustrates an example of battery pre-characterization information.

Figure 5:
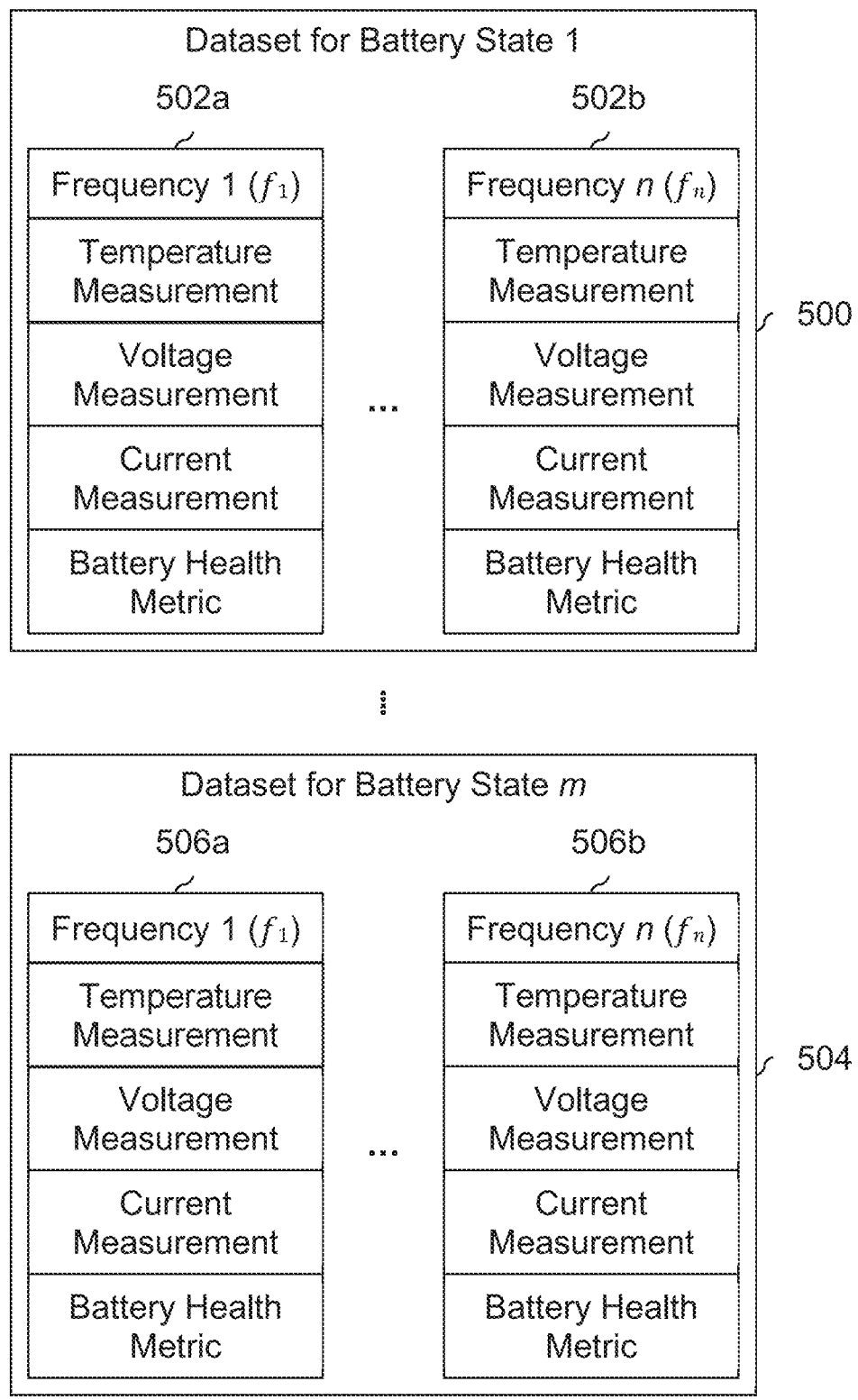
FIG. 5 is a diagram illustrating an embodiment of battery pre-characterization information.

FIG. 5 is a diagram illustrating an embodiment of battery pre-characterization information. In this example, the battery pre-characterization information shown includes a dataset (500) for a first battery state, a dataset (504) for an $m^{th}$ battery state, as well as other datasets for other battery states (not shown). For example, the first battery state may correspond to a best, newest, and/or least worn out battery state, the $m^{th}$ battery state may correspond to a worst, oldest, and/or most worn out battery state, and the other battery states are intermediate battery states between those two extremes.

In each dataset (e.g., 500 and 504), measurements and/or information for a range of (e.g., discrete) frequencies are stored. The dataset (500) for the first battery state includes (e.g., stored and/or lab-obtained) first frequency information (502a), including a temperature measurement, a voltage measurement, a current measurement, and a battery health metric. The dataset (500) for the first battery state also includes information for an $n^{th}$ frequency (502b), as well as information for other frequencies (not shown).

Similarly, the dataset for the $m^{th}$ battery state (504) includes information at or otherwise associated with a first frequency (506a), information at or otherwise associated with an $n^{th}$ frequency (506b), as well as information for other frequencies (not shown).

In one example, a closest datapoint is selected (e.g., select one of 502a, 502b, 506a, 506b, . . . ) and the corresponding battery health metric from the selected datapoint is output (e.g., unmodified) as the battery health metric for the battery block being assessed or otherwise evaluated. Alternatively, in some other embodiments, other techniques (e.g., interpolation, extrapolation, etc.) are used.

The following figure illustrates an example of this more formally in a flowchart.

Figure 6:
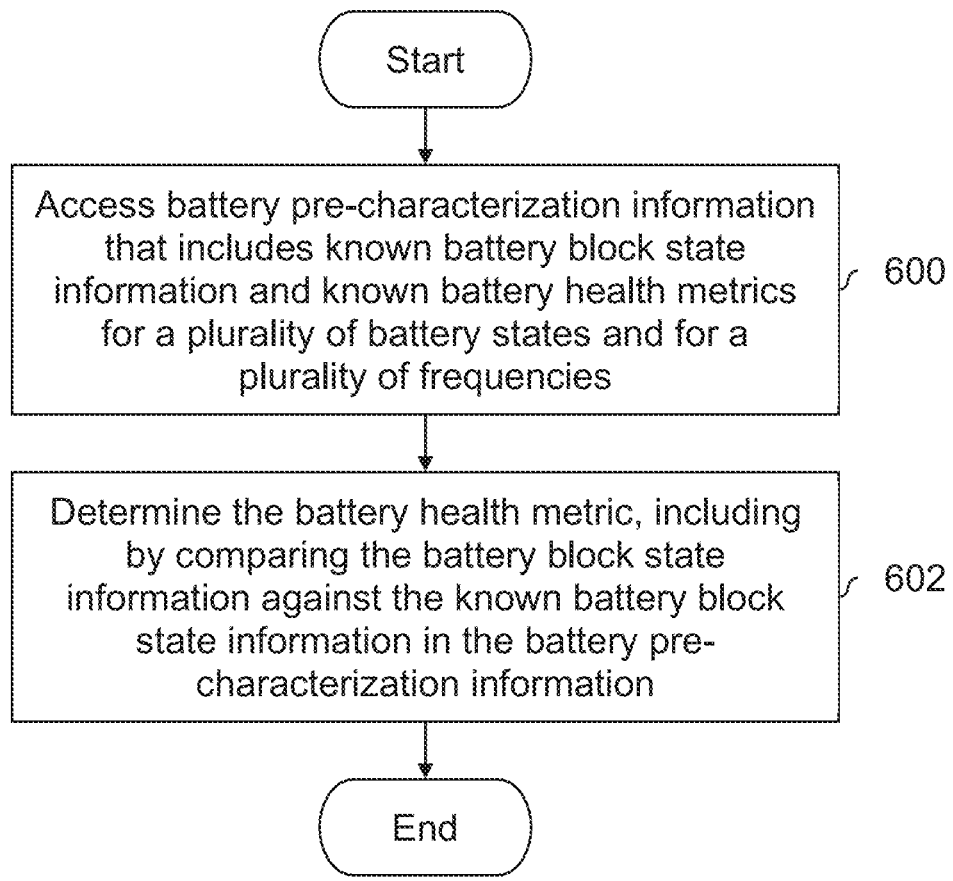
FIG. 6 is a flowchart illustrating an embodiment of a process to determine a battery health metric using battery pre-characterization information.

FIG. 6 is a flowchart illustrating an embodiment of a process to determine a battery health metric using battery pre-characterization information. In some embodiments, step 110 in FIG. 1 is performed using the example process shown here. In FIG. 6, to better distinguish between the (e.g., stored and/or lab-obtained) information in the battery pre-characterization information and the more recently obtained information, the battery pre-characterization information is referred to or otherwise characterized in FIG. 6 as "known."

At 600, battery pre-characterization information that includes known battery state information and known battery health metrics for a plurality of battery states and for a plurality of frequencies is accessed.

In FIG. 5, for example, known battery state information and known battery health metrics are shown for m battery states (where m≥2) and for n frequencies (where n≥2)

In some embodiments, the battery pre-characterization information is stored off-device (e.g., external to an ESS) and/or on some (e.g., cloud) storage system and the stored information is accessed (e.g., at step 600) from that system.

Returning to FIG. 6, at 602, the battery health metric is determined, including by comparing the (e.g., recently-obtained) battery state information (e.g., received at step 108 in FIG. 1) against the known battery state information (e.g., the temperature, voltage, and current measurements shown in FIG. 5) in the battery pre-characterization information.

As described above, step 602 may include selecting a best datapoint and outputting (e.g., unmodified) the battery health metric contained therein, or by extrapolating or interpolating the battery pre-characterization information.

The following figure illustrates an example where a server generates battery health metrics using battery pre-characterization information.

Figure 7:
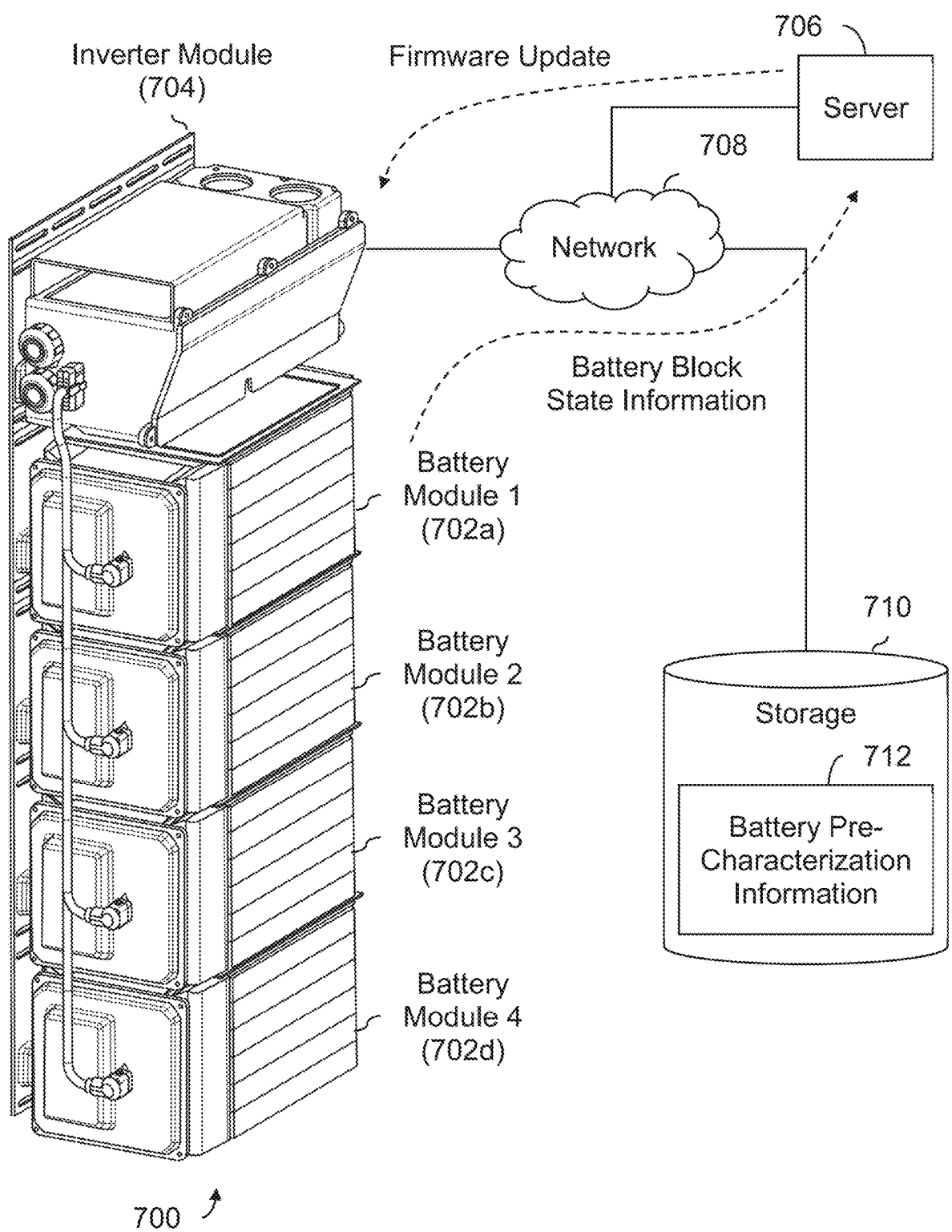
FIG. 7 is a diagram illustrating an embodiment of a modular ESS system where a remote server generates battery health metrics using battery pre-characterization information.

FIG. 7 is a diagram illustrating an embodiment of a modular ESS system where a remote server generates battery health metrics using battery pre-characterization information. In this example, there is a modular ESS system (700), which is a wall-mounted and modular system with a variable number of battery modules (702a-702d) that are managed by an inverter module (704). For example, if more power storage capacity is desired, more battery modules are incorporated and installed. In this particular example, there are four battery modules (702a-702d). To more clearly show interior components, the shells or cases of the inverter module (704) and battery modules (702a-702d) have been removed in this diagram. To put FIG. 7 into context with FIG. 2, the inverter module (704) may include the power converter (210), controller (214), and BMS module (212) from FIG. 2 and each of the battery modules (702a-702d) may include (e.g., their own) DC-DC power converter (206) and battery blocks (204) from FIG. 2.

In the example of FIG. 7, to roll out a new feature or ability to generate a battery health metric, a firmware update is sent from the server (706) to a controller in the inverter module (704) via a network (708). The new firmware may, for example, enable the controller in the inverter module (704) to instruct or configure an inverter and/or power converter in the inverter module (704) to generate a measurement-related AC signal (see, e.g., step 106 in FIG. 1) for one or more of the battery block(s) in the battery modules (e.g., 702a-702d) if the controller decides to perform a health-related measurement.

In response to the measurement-related AC signal, battery state information is obtained and sent from (e.g., selected) battery modules (702a-702d) to the server (706) via the network (708). In this particular example, the server (706) is generating the battery health metric and so the battery state information is sent to the server (706). As described above, in some embodiments, the battery state information includes or takes the form of discrete-frequency state information (e.g., associated with the battery block responding to the measurement-related AC signal at one or more discrete frequencies).

In this example, the server (706) generates battery health metric(s) by comparing the (e.g., received) battery state information against the battery pre-characterization information (712) stored in storage (710) and which is accessible via the network (708). This may be desirable because fewer system resources are consumed (e.g., to find an opportunity to measure the battery blocks in the battery modules (702a-702d), to store the measured values, to send the measured values across the network (708), etc.).

Independent of whether battery pre-characterization information is used to determine a battery health metric, a modular ESS system (e.g., 700) may be able to put its battery modules (702a-702d) into independent state or functional modes, so that some battery module(s) are measured while other battery module(s) perform some primary and/or operational tasks. The following figure shows an example of this.

Figure 8:
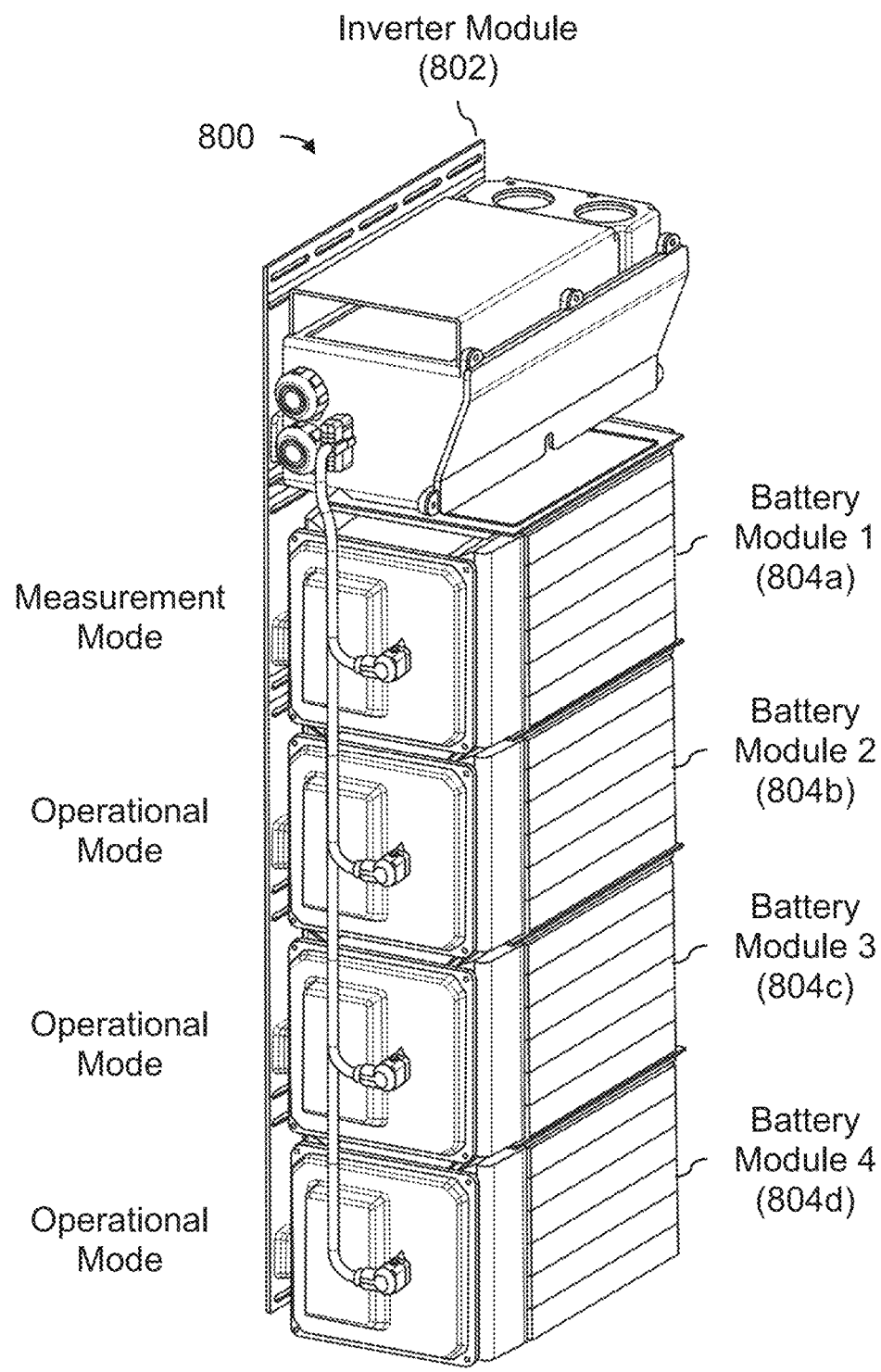
FIG. 8 is a diagram illustrating an embodiment of a modular ESS system where some battery modules are in a measurement mode and others are in an operational mode.

FIG. 8 is a diagram illustrating an embodiment of a modular ESS system where some battery modules are in a measurement mode and others are in an operational mode. As in the previous example, the modular ESS system (800) includes an inverter module (802) and four battery modules (804a-804d) and the battery modules (at least in this example) can be configured independently of each other (e.g., so that one battery module is in one mode or functionality and another battery module is in another mode or functionality). In the state shown here, the first battery module (804a) is put into a measurement mode (e.g., so that a battery health metric can be generated for that battery module) while the rest of the battery modules (804b-804d) are in an operational mode.

Being able to independently configure and measure battery modules as shown in this example may be desirable because it permits battery health metrics to be generated without requiring the entire ESS to go offline. It is noted that some other power systems (e.g., manufactured by other companies) do not have battery modules with this ability to independently configure and/or measure battery modules and all of the batteries have to go offline to estimate the health of the batteries which is undesirable.

In some embodiments, there are a variety of limitations, requirements, and/or restrictions associated with performing health measurement using the techniques described herein. The following figure shows an example of this.

Figure 9:
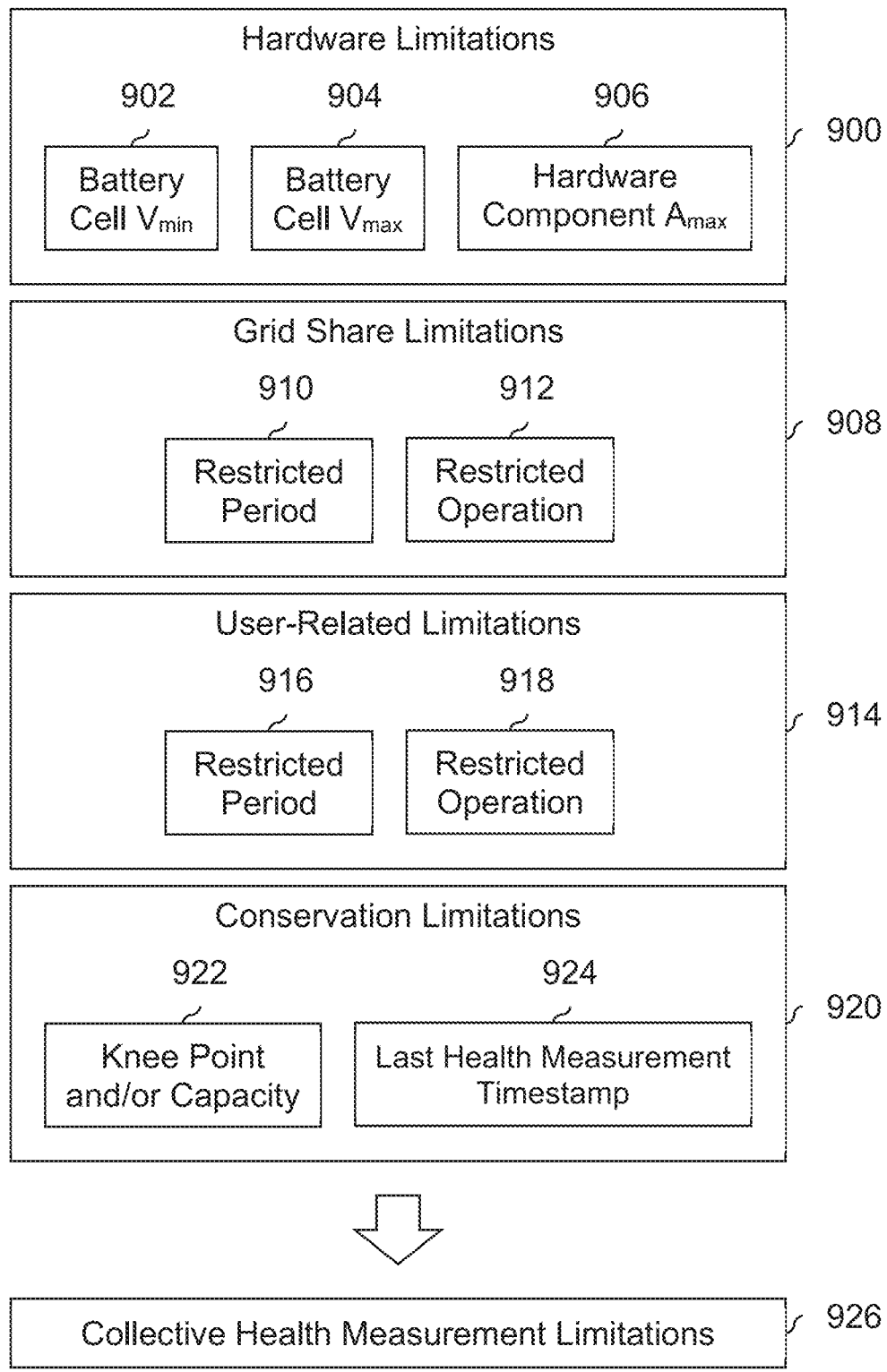
FIG. 9 is a diagram illustrating an embodiment of layers of limitations that affect and/or are otherwise used to manage the health measurement techniques described herein.

FIG. 9 is a diagram illustrating an embodiment of layers of limitations that affect and/or are otherwise used to manage the health measurement techniques described herein. In this example, there are multiple layers of limitations or restrictions (e.g., 900, 908, 914, and 920), each of which is associated with a particular source and/or application.

In this example, the hardware limitations (900) are associated with and/or are used to describe the limitations that are associated with hardware in the system, such as the (component) battery cells (e.g., that form the batteries, battery modules, etc. in the system) or the electronic components that "surround" and/or are (e.g., electrically) connected to the batteries (e.g., including via an intervening electronic component). The hardware limitations (900) include (in this example at least) a battery cell minimum voltage ($V_{min}$) for the (e.g., component) battery cells (902) as well as a corresponding battery cell maximum voltage ($V_{max}$) (904). For example, the battery cell $V_{min}$ (902) may be 2 volts and the battery cell $V_{max}$ (904) may be 4 volts, below and above which the battery cells are not permitted to be and/or operate at (e.g., for safety, warranty reasons, etc.).

In this example, the hardware limitations (900) also include a hardware component maximum current ($A_{max}$) (906). For example, these hardware components may be part of an ESS system and be affected by a battery health measurement. In one example, battery cells may be able to handle hundreds of amperes of current (e.g., charging or discharging) during the health measurement, but other hardware components in the system may only be able to tolerate 60 amperes of current (as an example). In some embodiments, there are multiple hardware component $A_{max}$ (e.g., software and/or firmware) variables, (e.g., hardware) registers, etc. to account for multiple hardware components with different $A_{max}$ values.

In some applications, the use of a (e.g., software and/or firmware) variable or (e.g., hardware) register for this and/or other limitations is desirable in case the components and/or state of the system changes (e.g., a battery pack with a new type of battery cell is swapped in).

In this example, another layer of limitations is the grid share limitations (908) that are associated with and/or specific to the (e.g., local) power grid within which the system operates. For example, suppose that a power system (see, e.g., FIGS. 7 and 8) is in the San Francisco Bay Area and there is a heat wave. In response to the heat wave, there may be an order (e.g., by a utility company and/or a regulatory authority) to limit consumption or operations (e.g., cannot discharge or charge a battery in a power system beyond some specified energy or power limit). A manager of a fleet of power systems (such as a power system provider and/or managing company (e.g., Lunar Energy, Inc.) may set the restricted period (910) to correspond to the expected heat wave and set the restricted operations (912) to some appropriate value (e.g., a Boolean TRUE/FALSE binary value regarding whether health measurements are permitted; an energy or power consumption limit or budget that a health measurement cannot exceed; etc.) for those power systems that are within the affected area. Power systems that are in unaffected areas (in this example, not under a heat-related restriction) would not necessarily have their grid share limitations (908) modified in this manner.

The user-related limitations (914) are associated with limitations that are specified by the user (e.g., user-defined) or are otherwise associated with the user (e.g., not set by the user, but geared towards performing the health measurement in a manner that would be (as an example) noticeable and or perceived by the user, particularly in a negative way). As an example of the former (e.g., user-defined) limitation, suppose that a user is going on vacation and does not want any charging or discharging beyond (e.g., absolutely) essential operations. The exemplary restricted period (916) may be set to the vacation period and the restructured operation (918) (e.g., a Boolean value, or a limit or budget) may be set accordingly.

In another example, the user-related limitations (914) are set (e.g., by a system manager and not the user) so that health measurement is performed, but in a manner that reduces the likelihood of being detected by a user, or if it is noticed then it is less likely to irritate the user. For example, the restricted operation (918) may limit the charge and discharge levels or (total) power or energy consumption amounts to be less noticeable and/or objectionable and/or the restricted period (916) may be set so that the health measurement overlaps with and/or piggybacks off of another mode or operation so that the health measurement is less noticeable and/or objectionable.

Conceptually, the limitations described above (900, 908, and 914) fall under the general category or question of, "Can the system do this?" or "Is the system permitted to do this?" Even if a system is permitted to do something (i.e., a health measurement), it may be useful (e.g., from a conservation point of view) to consider the (e.g., subsequent or secondary) question of "Should the system do this?" The conservation limitations (920) are associated with such considerations or questions.

In this example, the conservation limitations (920) include a knee point value and/or capacity value (922). For example, as a battery ages or gets worn out, the battery will eventually hit a knee point, at which point the battery health, capacity, and/or performance will rapidly drop off (e.g., at a rate distinctly different that prior to the knee point). As such, it is important, especially as a battery gets closer to the knee point, to have an accurate and up-to-date battery health metric so that a battery can be replaced before or during the knee point. However, while the battery is still at high capacity and/or in good health (e.g., above some threshold such as 90% capacity) and the knee point is far off, it may be unnecessary and even wasteful of (e.g., power and/or processing) resources to frequently perform health measurements. To that end, the knee point and/or capacity value (922) is used to track or otherwise estimate how far away the knee point is, and whether performing health metrics more frequently would be helpful and not wasteful. In some embodiments, there is a knee point estimator (e.g., which outputs a value estimating how far away the knee point is) and the output of the estimator is stored in knee point and/or capacity value (922). In some embodiments, a most recent battery capacity value is stored as the knee point and/or capacity value (922).

The conservation limitations (920) also include a last health measurement timestamp (924) which records when the last (e.g., most recent) health measurement was performed. In various embodiments, this timestamp (924) includes a date and/or time. For example, an opportunity may present itself to perform a health measurement (e.g., the system can or is otherwise permitted to perform a health measurement per the other limitations) but the system may use the last health measurement stored in 924 to decide if the system should perform a health measurement (e.g., whether the last health measurement stored in 924 is within an acceptable recency period, such that performing a health measurement at this particular point would be somewhat wasteful and/or not entirely necessary).

All of these limitations (900, 908, 914, and 920) are combined to generate collective health measurement limitations (926). For example, this may affect a decision about whether to perform the health measurement process shown in FIG. 1 and if so, the manner in which a health measurement process (e.g., shown in FIG. 1) is performed (e.g., what a health measurement waveform or signal such as that shown in FIG. 3 looks like, including a total amount of energy or power consumed by a particular waveform or signal).

As shown in this example, in some embodiments, the measurement-related AC signal is generated (e.g., by an inverter and/or power converter) in response to receiving a control signal. In some embodiments, such a control signal is generated based at least in part on: one or more hardware limitations that include one or more of the following: a battery cell minimum voltage, a battery cell maximum voltage, or a hardware component maximum current; one or more grid share limitations that include one or more of the following: a restricted period or a restricted operation; one or more user-related limitations that include one or more of the following: a restricted period or a restricted operation; and/or one or more conservation limitations that include one or more of the following: a knee point value, a capacity value, or a last health measurement timestamp.

The waveform shown in FIG. 3 is an ideal waveform and in real world applications, the actual signal may differ greatly from an ideal waveform. The following figure describes an embodiment where a combination of hardware and software filters are used to improve the quality of a signal (e.g., to better match an ideal waveform).

Figure 10:
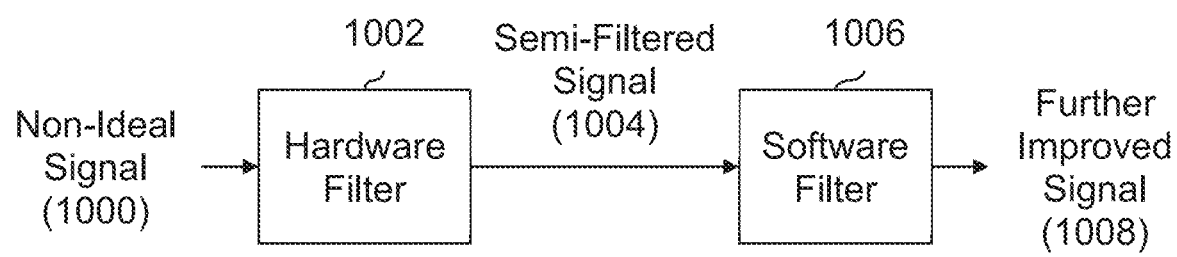
FIG. 10 is a block diagram illustrating an embodiment of a hardware filter and a software filter that inputs a non-ideal signal and outputs an improved signal.

FIG. 10 is a block diagram illustrating an embodiment of a hardware filter and a software filter that inputs a non-ideal signal and outputs an improved signal. For example, in a real-world application, a measurement-related AC signal (e.g., output by power converter 210 in FIG. 2) may include noise so that the signal or waveform does not match an ideal one (e.g., the ideal one shown in FIG. 3). Within the context of FIG. 2, a hardware filter (e.g., 1002 in FIG. 10) and a software filter (e.g., 1006 in FIG. 10) may reside somewhere between the power converter (210) and the battery block(s) (204).

To improve the quality of a signal so that it better matches an ideal signal (and to correspondingly improve the quality and/or accuracy of the health metric that is generated), the non-ideal signal (1000) is first passed to a hardware filter (1002), for example implemented as an ASIC or FPGA, which outputs a semi-filtered signal (1004). In one example, the hardware filter (1002) is an analog front end (AFE) integrated circuit.

Using a hardware filter (1002) for a first, initial pass of filtering may be desirable for a number of reasons. One benefit is that a hardware filter may be well suited to properly handle the relatively high frequency signals that are input (e.g., in the non-ideal signal (1000) that is input). Since the frequencies and other relevant characteristics of the non-ideal signal (1000) are known ahead of time, an appropriate hardware filter (e.g., suited to the frequencies) can be selected and/or the configurations and settings can be appropriately set. In contrast, a software filter acting alone (or at least as the first filter) may not be able to properly handle the frequencies involved.

Another benefit to using hardware filter (1002) for a first, initial pass of filtering, is that they output (e.g., in the semi-filtered signal (1000)) "stable" values so that that processing burden on the downstream software filter (1006) is reduced. For example, a CPU associated with the software filter (1006) may only have to do a process every 10 milliseconds instead of every one microsecond (e.g., if the hardware filter (1002) did not perform a first, initial pass of filtering).

The semi-filtered signal (1004) is then passed to a software filter (1006) which further refines and improves the signal (e.g., so that it more closely resembles the step function shown in FIG. 3) and outputs a further improved signal (1008).

In some embodiments, the hardware filter (1002) and software filter (1006) are (already) included in a power system that is (already) deployed in the field. As described above, the techniques described herein may be attractive because they permit a new health metric generation technique to be implemented or otherwise rolled out (e.g., even to power system that are already deployed) without requiring new hardware.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A power system, comprising:
a power converter that is used to generate a measurement-related AC signal at a measured discrete frequency;
a battery that receives the measurement-related AC signal at the measured discrete frequency and responds to the measurement-related AC signal at the measured discrete frequency; and
a controller that:
receives discrete-frequency battery state information associated with the battery responding to the measurement-related AC signal at the measured discrete frequency; and
determines a battery health metric based at least in part on the discrete-frequency battery state information and battery pre-characterization information, including by:
receiving the battery pre-characterization information, wherein the battery pre-characterization information includes:
a first dataset of known battery state information associated with a healthier battery state that includes, for a plurality of pre-characterization discrete frequencies, at least one measurement associated with each of the plurality of pre-characterization discrete frequencies and a battery health metric associated with each of the plurality of pre-characterization discrete frequencies; and
a second dataset of known battery state information associated with an unhealthier battery state that includes, for a plurality of pre-characterization discrete frequencies, at least one measurement associated with each of the plurality of pre-characterization discrete frequencies and a battery health metric associated with each of the plurality of pre-characterization discrete frequencies; and
comparing the discrete-frequency state information against the battery pre-characterization information in order to determine the battery health metric.

2. The power system recited in claim 1, wherein the battery health metric includes one or more of the following: a capacity of the battery or an impedance of the battery.

3. The power system recited in claim 1, wherein:
the power converter generates the measurement-related AC signal in response to receiving a control signal; and
the control signal is generated based at least in part on one or more hardware limitations that include one or more of the following: a battery cell minimum voltage, a battery cell maximum voltage, or a hardware component maximum current.

4. The power system recited in claim 1, wherein:
the power converter generates the measurement-related AC signal in response to receiving a control signal; and
the control signal is generated based at least in part on one or more grid share limitations that include one or more of the following: a restricted period or a restricted operation.

5. The power system recited in claim 1, wherein:
the power converter generates the measurement-related AC signal in response to receiving a control signal; and
the control signal is generated based at least in part on one or more user-related limitations that include one or more of the following: a restricted period or a restricted operation.

6. The power system recited in claim 1, wherein:
the power converter generates the measurement-related AC signal in response to receiving a control signal; and
the control signal is generated based at least in part on one or more conservation limitations that include one or more of the following: a knee point value, a capacity value, or a last health measurement timestamp.

7. The power system recited in claim 1, further including:
a hardware filter, wherein:
the power converter outputs a non-ideal signal; and
the hardware filter inputs the non-ideal signal and outputs a semi-filtered signal; and
a software filter, wherein:
the software filter inputs the semi-filtered signal and outputs a further improved signal; and
the further improved signal is used as the measurement-related AC signal.

8. A method, comprising:
using a power converter to generate a measurement-related AC signal at a measured discrete frequency;
receiving, at a battery, the measurement-related AC signal at the measured discrete frequency and respond to the measurement-related AC signal at the measured discrete frequency;
receiving discrete-frequency battery state information associated with the battery responding to the measurement-related AC signal at the measured discrete frequency; and
determining a battery health metric based at least in part on the discrete-frequency battery state information and battery pre-characterization information, including by:
receiving the battery pre-characterization information, wherein the battery pre-characterization information includes:
a first dataset of known battery state information associated with a healthier battery state that includes, for a plurality of pre-characterization discrete frequencies, at least one measurement associated with each of the plurality of pre-characterization discrete frequencies and a battery health metric associated with each of the plurality of pre-characterization discrete frequencies; and
a second dataset of known battery state information associated with an unhealthier battery state that includes, for a plurality of pre-characterization discrete frequencies, at least one measurement associated with each of the plurality of pre-characterization discrete frequencies and a battery health metric associated with each of the plurality of pre-characterization discrete frequencies; and
comparing the discrete-frequency state information against the battery pre-characterization information in order to determine the battery health metric.

9. The method recited in claim 8, wherein the battery health metric includes one or more of the following: a capacity of the battery or an impedance of the battery.

10. The method recited in claim 8, wherein:
the power converter generates the measurement-related AC signal in response to receiving a control signal; and
the control signal is generated based at least in part on one or more hardware limitations that include one or more of the following: a battery cell minimum voltage, a battery cell maximum voltage, or a hardware component maximum current.

11. The method recited in claim 8, wherein:
the power converter generates the measurement-related AC signal in response to receiving a control signal; and the control signal is generated based at least in part on one or more grid share limitations that include one or more of the following: a restricted period or a restricted operation.

12. The method recited in claim 8, wherein:
the power converter generates the measurement-related AC signal in response to receiving a control signal; and
the control signal is generated based at least in part on one or more user-related limitations that include one or more of the following: a restricted period or a restricted operation.

13. The method recited in claim 8, wherein:
the power converter generates the measurement-related AC signal in response to receiving a control signal; and
the control signal is generated based at least in part on one or more conservation limitations that include one or more of the following: a knee point value, a capacity value, or a last health measurement timestamp.

14. The method recited in claim 8, wherein:
the power converter outputs a non-ideal signal;
the method further includes:
    using a hardware filter to input the non-ideal signal and output a semi-filtered signal; and
    using a software filter to input the semi-filtered signal and output a further improved signal; and
the further improved signal is used as the measurement-related AC signal.

15. A computer program product embodied in a non-transitory computer readable medium and comprising computer instructions for:
    using a power converter to generate a measurement-related AC signal at a measured discrete frequency;
    receiving, at a battery, the measurement-related AC signal at the measured discrete frequency and respond to the measurement-related AC signal at the measured discrete frequency;
    receiving discrete-frequency battery state information associated with the battery responding to the measurement-related AC signal at the measured discrete frequency; and
    determining a battery health metric based at least in part on the discrete-frequency battery state information and battery pre-characterization information, including by:
        receiving the battery pre-characterization information, wherein the battery pre-characterization information includes:
            a first dataset of known battery state information associated with a healthier battery state that includes, for a plurality of pre-characterization discrete frequencies, at least one measurement associated with each of the plurality of pre-characterization discrete frequencies and a battery health metric associated with each of the plurality of pre-characterization discrete frequencies; and
            a second dataset of known battery state information associated with an unhealthier battery state that includes, for a plurality of pre-characterization discrete frequencies, at least one measurement associated with each of the plurality of pre-characterization discrete frequencies and a battery health metric associated with each of the plurality of pre-characterization discrete frequencies; and
        comparing the discrete-frequency state information against the battery pre-characterization information in order to determine the battery health metric.

\* \* \* \* \*